United States Patent
Hiramoto et al.

(10) Patent No.: US 9,021,405 B2
(45) Date of Patent: Apr. 28, 2015

(54) LAYOUT METHOD AND METHOD OF MANUFACTURING SEMICONDUCTOR DEVICE

(75) Inventors: Takanori Hiramoto, Yokohama (JP); Toshio Hino, Yokohama (JP); Tsuyoshi Sakata, Yokohama (JP); Yutaka Mizuno, Yokohama (JP); Katsuya Ogata, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 100 days.

(21) Appl. No.: 13/494,145

(22) Filed: Jun. 12, 2012

(65) Prior Publication Data

US 2012/0329266 A1 Dec. 27, 2012

(30) Foreign Application Priority Data

Jun. 27, 2011 (JP) ................. 2011-142067

(51) Int. Cl.
*G06F 17/50* (2006.01)
*H01L 27/02* (2006.01)
*H01L 27/118* (2006.01)

(52) U.S. Cl.
CPC ...... *H01L 27/0207* (2013.01); *H01L 27/11807* (2013.01)

(58) Field of Classification Search
CPC . H01L 27/0207; H01L 27/11; H01L 27/1104; H01L 21/32139; H01L 27/11807; G03F 7/0035; G03F 7/20; G03F 17/50; G03F 17/5068
USPC .................... 716/50–56; 430/5, 30
See application file for complete search history.

(56) References Cited

U.S. PATENT DOCUMENTS

| | | | |
|---|---|---|---|
| 8,148,052 B2 * | 4/2012 | Vanleenhove et al. | 430/315 |
| 8,631,374 B2 * | 1/2014 | Sherlekar | 716/119 |
| 8,642,451 B2 * | 2/2014 | Chang et al. | 438/478 |
| 2009/0169832 A1 * | 7/2009 | Aton | 428/195.1 |
| 2010/0133589 A1 | 6/2010 | Aruga et al. | |
| 2010/0252893 A1 * | 10/2010 | Becker | 257/369 |
| 2011/0084313 A1 * | 4/2011 | Witters et al. | 257/204 |
| 2012/0108036 A1 * | 5/2012 | Chang et al. | 438/478 |
| 2012/0219917 A1 * | 8/2012 | McGuinness et al. | 430/312 |
| 2013/0292749 A1 * | 11/2013 | Okuno, Masaki | 257/288 |

FOREIGN PATENT DOCUMENTS

| | | |
|---|---|---|
| JP | 2001-168197 A | 6/2001 |
| JP | 2010-129895 A | 6/2010 |
| WO | 2005/041301 A1 | 5/2005 |

OTHER PUBLICATIONS

"Timing Yield-Aware Color Reassignment and Detailed Placement Perturbation for Double Patterning Lithography", by Mohit Gupta, Kwangok Jeong, and Andrew B. Kahng, @2009 ACM.*

* cited by examiner

*Primary Examiner* — Nha Nguyen
(74) *Attorney, Agent, or Firm* — Westerman, Hattori, Daniels & Adrian, LLP

(57) ABSTRACT

A plurality of gate electrode patterns to be laid out in parallel are alternately set as first patterns to be formed in a first exposure step of double patterning and as second patterns to be formed in a second exposure step. Subsequently, a circuit that includes transistor pairs each formed by connecting one of the first patterns and one of the second patterns in parallel is laid out. This reduces the risk of variations in characteristics of transistors caused by double patterning.

11 Claims, 12 Drawing Sheets

US 9,021,405 B2

LAYOUT METHOD AND METHOD OF MANUFACTURING SEMICONDUCTOR DEVICE

CROSS-REFERENCE TO RELATED APPLICATION

This application is based upon and claims the benefit of priority of the prior Japanese Patent Application No. 2011-142067, filed on Jun. 27, 2011, the entire contents of which are incorporated herein by reference.

FIELD

The embodiments discussed herein are related to layout methods and methods of manufacturing semiconductor devices.

BACKGROUND

Patterns to be formed on semiconductor devices are laid out closer to each other as the size of the semiconductor devices decreases. This may cause interference of light during exposure, which is a step in a process of manufacturing semiconductor devices, and may prevent intended patterns from being formed.

To avoid this, target patterns may be formed by using two masks in two steps (double patterning or double exposure). This technique enables high-resolution patterns to be formed even using an exposure apparatus with a long wavelength since the patterns are formed with a relatively large pitch in each exposure step using the corresponding mask (see, for example, International Publication Pamphlet No. WO 2005/041301 and Japanese Laid-open Patent Publication Nos. 2010-129895 and 2001-168197).

However, patterns formed in the first step and those formed in the second step may vary (for example, in the entire wafers or chips) since target patterns are formed using two masks in two steps in the double patterning. This may lead to large variations in characteristics of transistors.

SUMMARY

According to one aspect of the invention, a layout method performed by a computer includes alternately setting a plurality of gate electrode patterns to be laid out in parallel as a first pattern to be formed in a first exposure step of double patterning and a second pattern to be formed in a second exposure step of the double patterning; and laying out a circuit that includes a transistor pair formed by connecting the first pattern and the second pattern in parallel.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
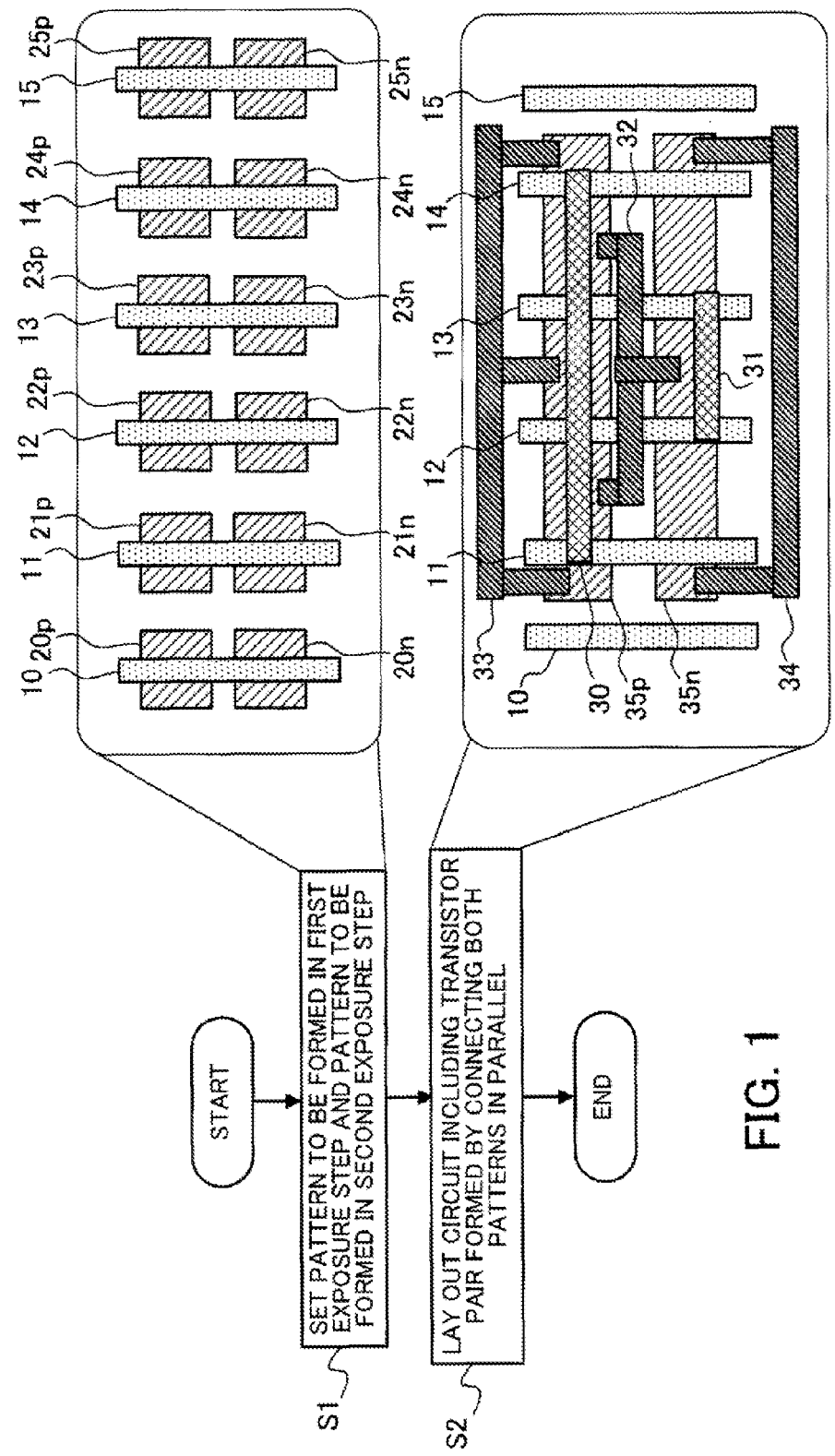
FIG. 1 illustrates an example layout method according to a first embodiment.

Several embodiments will be described below with reference to the accompanying drawings, wherein like reference numerals refer to like elements throughout.

(a) First Embodiment

FIG. 1 illustrates an example layout method according to a first embodiment.

Figure 12:
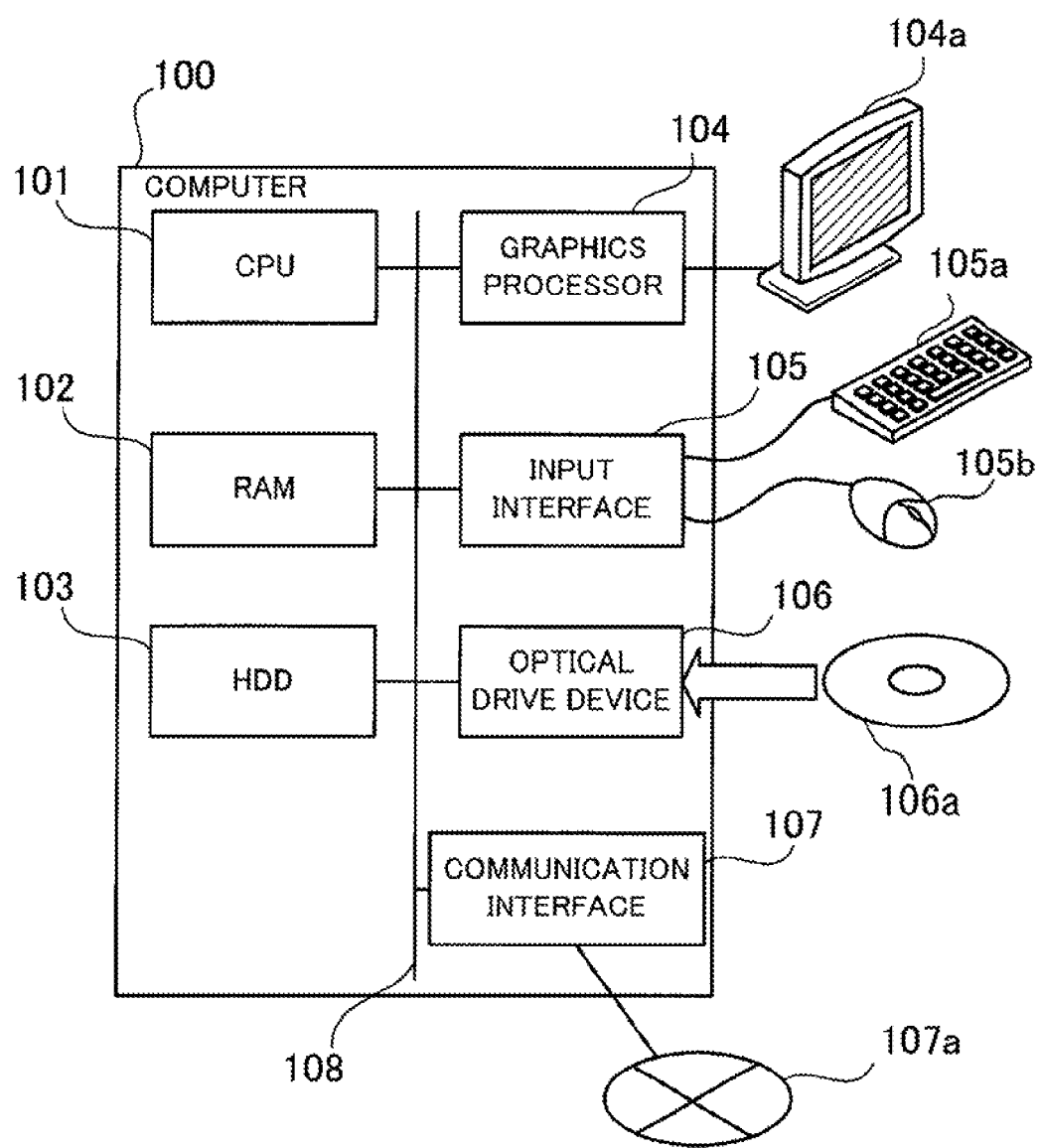
FIG. 12 illustrates an example hardware configuration of a computer used in the first and second embodiments.

The layout method is performed by a design apparatus (for example, a computer as illustrated in FIG. 12).

FIG. 1 illustrates a layout of a plurality of gate electrode patterns 10, 11, 12, 13, 14, and 15 of metal-oxide semiconductor field effect transistors (MOSFETs) disposed in parallel. The gate electrode patterns 10 to 15 extend from active regions 20$p$ to 25$p$ for p-channel MOSFETs, respectively, to active regions 20$n$ to 25$n$ for n-channel MOSFETs, respectively.

Since the pitch of the gate electrode patterns 10 to 15 is small, the gate electrode patterns are formed by double patterning in an exposure step in a process of manufacturing a semiconductor device.

With consideration of the double patterning, the following steps will be performed in a design phase of the layout method according to this embodiment.

First, the design apparatus alternately sets the plurality of gate electrode patterns 10 to 15 to be laid out in parallel as patterns to be formed in a first exposure step of the double patterning and as patterns to be formed in a second exposure step of the double patterning (Step S1).

In the example illustrated in FIG. 1, the design apparatus sets the gate electrode patterns 11, 13, and 15 as the patterns to be formed in the first exposure step, and the gate electrode patterns 10, 12, and 14 as the patterns to be formed in the second exposure step.

After setting the patterns as above, the design apparatus lays out a circuit that includes transistor pairs formed by connecting the patterns to be formed in the first exposure step and the patterns to be formed in the second exposure step in parallel (Step S2).

FIG. 1 illustrates an example layout of a two-input NAND circuit at the lower right.

A wiring pattern 30 connects the gate electrode pattern 11 formed in the first exposure step and the gate electrode pattern 14 formed in second exposure step in parallel, and thereby forms transistor pairs. A wiring pattern 31 connects the gate electrode pattern 13 formed in the first exposure step and the gate electrode pattern formed in the second exposure step in parallel, and thereby forms additional transistor pairs. A wiring pattern 32, a VDD power wiring pattern 33, and a VSS power wiring pattern 34 used to form the two-input NAND circuit are also included in the layout.

In this example, one of input signals to the two-input NAND circuit is supplied to the gate electrode patterns 11 and 14 in parallel via the wiring pattern 30 such that the transistor pair formed using the gate electrode patterns 11 and 14 is simultaneously turned on or off.

In addition, the other input signal to the two-input NAND circuit is supplied to the gate electrode patterns 12 and 13 in parallel via the wiring pattern 31 such that the transistor pair formed using the gate electrode patterns 12 and 13 is simultaneously turned on or off.

Herein, the active regions 20p to 25p and the active regions 20n to 25n are reset as active regions 35p and 35n, respectively. The gate electrode patterns 10 and 15 are not used to form the transistor, and set as dummy patterns for preventing, for example, inter-cell leakage current.

This layout provides a two-input NAND circuit as illustrated in the following circuit diagram.

Figure 2:
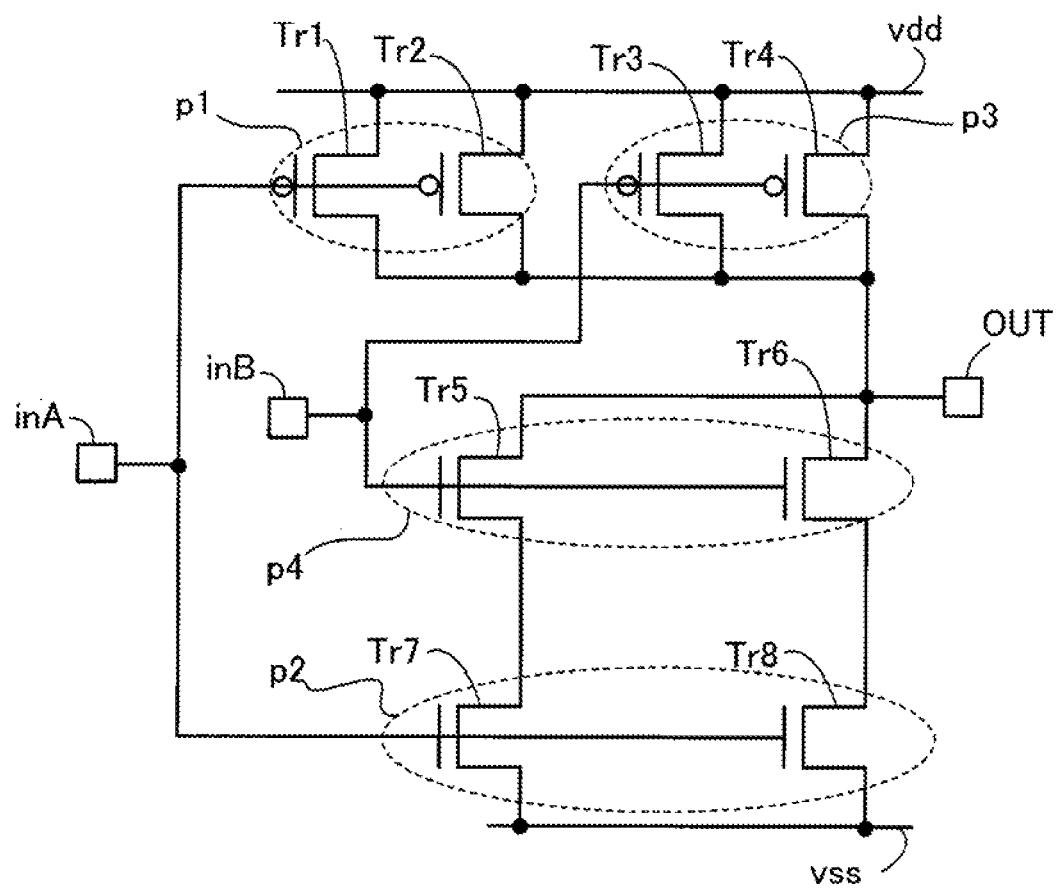
FIG. 2 is an example circuit diagram of a two-input NAND circuit provided by the layout method according to the first embodiment.

FIG. 2 is an example circuit diagram of the two-input NAND circuit provided by the layout method according to this embodiment.

The two-input NAND circuit provided by the layout method according to this embodiment includes transistors Tr1 to Tr8. The transistors Tr1 to Tr4 are p-channel MOSFETs, and the transistors Tr5 to Tr8 are n-channel MOSFETs.

The sources of the transistors Tr1 to Tr4 are connected to a VDD power line vdd, and the drains are connected to the drains of the transistors Tr5 and Tr6 and an output terminal OUT. The gates of the transistors Tr1 and Tr2 are connected to an input terminal inA, and the gates of the transistors Tr3 and Tr4 are connected to an input terminal inB.

The sources of the transistors Tr5 and Tr6 are connected to the drains of the transistors Tr7 and Tr8, and the gates are connected to the input terminal inB. The sources of the transistors Tr7 and Tr8 are connected to a VSS power line vss, and the gates are connected to the input terminal inA.

The transistor Tr1 is formed using the gate electrode pattern 11 and the active region 35p illustrated in FIG. 1, and the transistor Tr2 is formed using the gate electrode pattern 14 and the active region 35p. The transistor Tr3 is formed using the gate electrode pattern 12 and the active region 35p, and the transistor Tr4 is formed using the gate electrode pattern 13 and the active region 35p.

The transistor Tr5 is formed using the gate electrode pattern 12 and the active region 35n illustrated in FIG. 1, and the transistor Tr6 is formed using the gate electrode pattern 13 and the active region 35n. The transistor Tr7 is formed using the gate electrode pattern 11 and the active region 35n, and the transistor Tr8 is formed using the gate electrode pattern 14 and the active region 35n.

As illustrated in FIG. 2, the transistors Tr1 and Tr2 functions as a pair p1 and the transistors Tr7 and Tr8 functions as a pair p2 by connecting the gate electrode patterns 11 and 14 in parallel using the wiring pattern 30 as illustrated in FIG. 1. Similarly, the transistors Tr3 and Tr4 and the transistors Tr5 and Tr6 function as pairs p3 and p4, respectively, as illustrated in FIG. 2 by connecting the gate electrode patterns 12 and 13 in parallel using the wiring pattern 31 as illustrated in FIG. 1.

In this manner, the transistor pairs are formed by connecting the gate electrode patterns 11 and 13 formed in the first exposure step to the gate electrode patterns 14 and 12 formed in the second exposure step, respectively, in parallel. The use of the transistor pairs leads to a reduction in variations in characteristics of the transistors caused by double patterning.

In addition, connection of the gate electrode patterns 11 and 13 formed in the first exposure step to the gate electrode patterns 14 and 12 formed in the second exposure step, respectively, in parallel leads to an increase in the width of the gates of the transistors, and thereby leads to an increase in the amount of current flow.

Herein, formation of a two-input NAND circuit without transistor pairs by double patterning will be described as a comparative example of the layout method.

Figure 3:
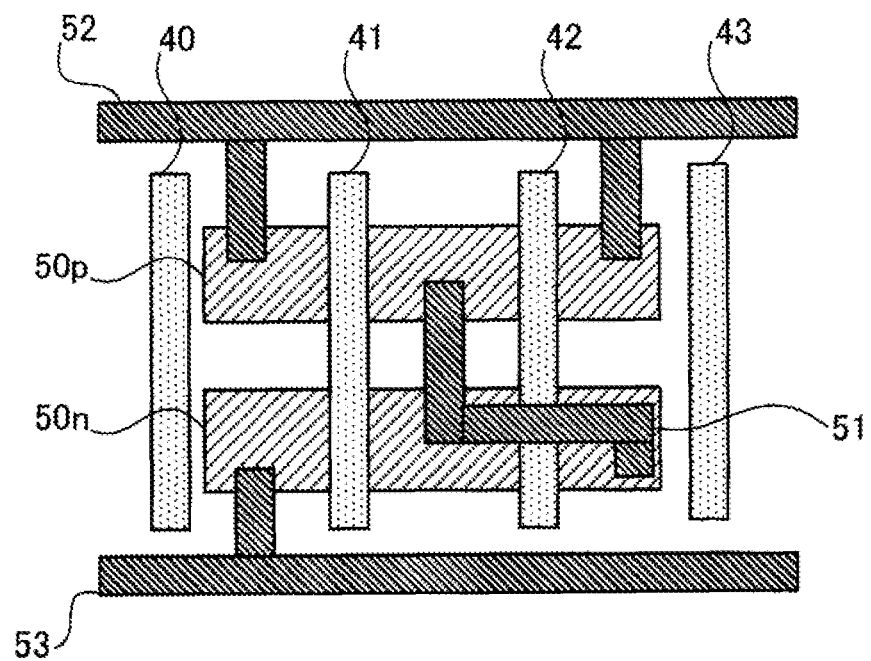
FIG. 3 illustrates a comparative example of a layout of a two-input NAND circuit.

FIG. 3 illustrates a comparative example of a layout of a two-input NAND circuit.

Gate electrode patterns 40 to 43 are laid out in parallel, and an active region 50p for p-channel MOSFETs and an active region 50n for n-channel MOSFETs are laid out under the gate electrode patterns 41 and 42. The gate electrode patterns 40 and 43 are defined as dummy patterns.

In addition, a wiring pattern 51, a VDD power wiring pattern 52, and a VSS power wiring pattern 53 are included in the layout. The wiring pattern 51 electrically connects portions of the active region 50n, the gate electrode pattern 42 being interposed between the portions, and the active regions 50p and 50n at a position between the gate electrode patterns 41 and 42.

Figure 4:
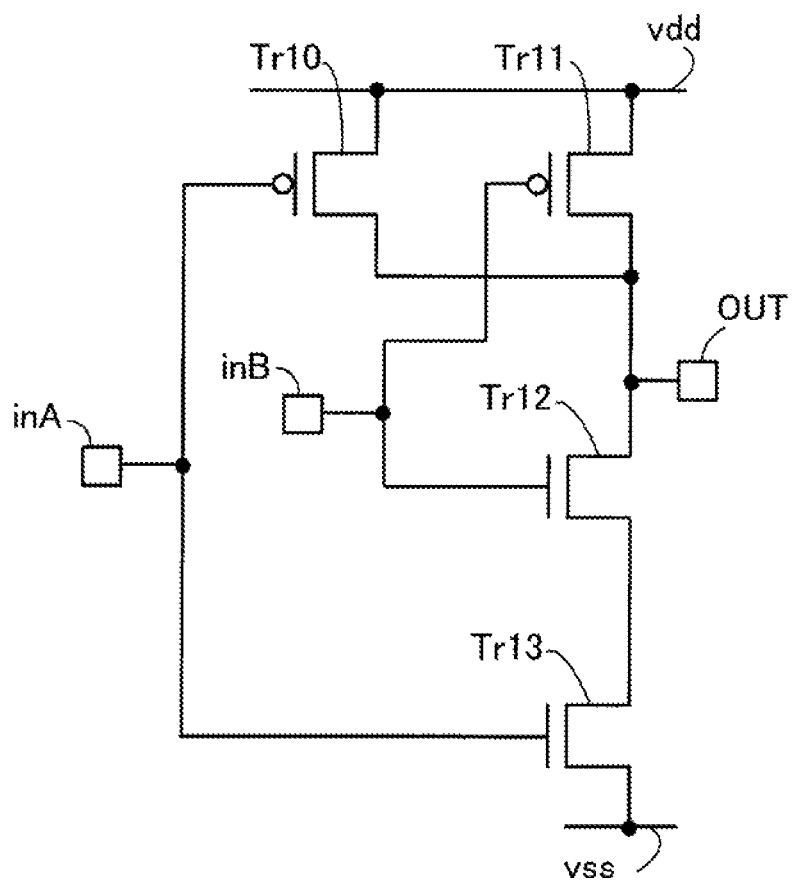
FIG. 4 illustrates a comparative example of a circuit diagram of the two-input NAND circuit.

FIG. 4 illustrates a comparative example of a circuit diagram of the two-input NAND circuit.

The two-input NAND circuit provided by the layout in FIG. 3 includes transistors Tr10 to Tr13. The transistors Tr10 and Tr11 are p-channel MOSFETs, and the transistors Tr12 and Tr13 are n-channel MOSFETs.

The sources of the transistors Tr10 and Tr11 are connected to a VDD power line vdd, and the drains are connected to the drain of the transistors Tr12 and an output terminal OUT. The gate of the transistor Tr10 is connected to an input terminal inA, and the gate of the transistor Tr11 is connected to an input terminal inB.

The source of the transistor Tr12 is connected to the drain of the transistor Tr13, and the gate is connected to the input terminal inB. The source of the transistor Tr13 is connected to a VSS power line vss, and the gate is connected to the input terminal inA.

The transistor Tr10 is formed using the gate electrode pattern 41 and the active region 50p illustrated in FIG. 3, and the transistor Tr11 is formed using the gate electrode pattern 42 and the active region 50p.

The transistor Tr12 is formed using the gate electrode pattern 42 and the active region 50n illustrated in FIG. 3, and the transistor Tr13 is formed using the gate electrode pattern 41 and the active region 50n.

When the gate electrode patterns 41 and 43 are formed in the first exposure step and the gate electrode patterns 40 and 42 are formed in the second exposure step by double patterning, gate delays may vary in the transistors Tr10 to Tr13 as described below.

Figure 5:
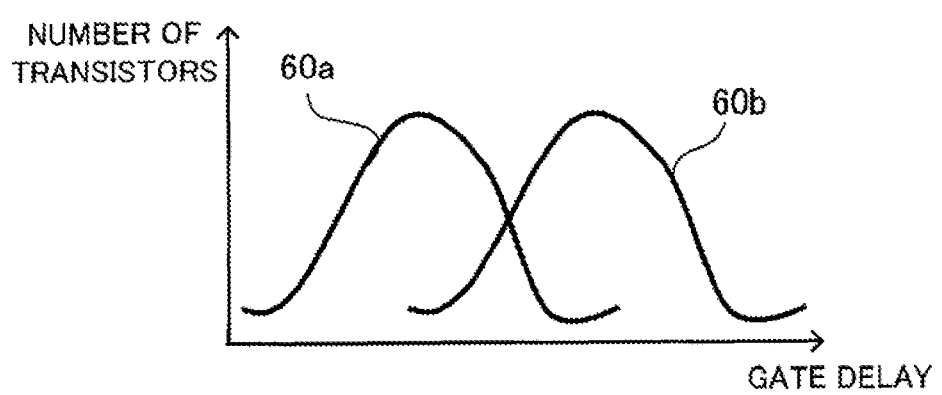
FIG. 5 illustrates example distributions gate delay variations.

FIG. 5 illustrates example distributions of gate delay variations.

The abscissa represents gate delay while the ordinate represents the number of transistors exhibiting the gate delay (for example, the number of transistors in the entire wafer or chip).

A distribution 60a indicates example variations in gate delay of the transistors Tr10 and Tr13 formed using the gate electrode pattern 41 formed in the first exposure step. A distribution 60b indicates example variations in gate delay of the transistors Tr11 and Tr12 formed using the gate electrode pattern 42 formed in the second exposure step.

That is, formation of the gate electrode patterns 41 to 43 in the two separate exposure steps of double patterning causes the two distributions 60*a* and 60*b* of variations as illustrated in FIG. 5, resulting in large variations as a whole.

In contrast, the layout method according to the first embodiment illustrated in FIG. 1 provides a distribution of gate delay variations as described below.

Figure 6:
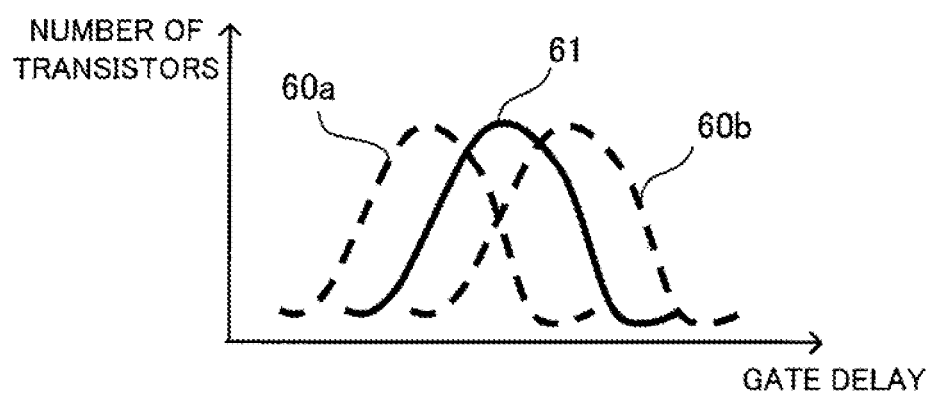
FIG. 6 illustrates an example distribution of gate delay variations when the layout method according to the first embodiment is applied.

FIG. 6 illustrates an example distribution of gate delay variations when the layout method according to the first embodiment is applied.

The abscissa represents gate delay while the ordinate represents the number of transistors exhibiting the gate delay (for example, the number of transistors in the entire wafer or chip).

A distribution 61 exhibits variations in gate delay of the transistors in the pairs p1 to p4 as illustrated in FIG. 2. The range of the variations is narrower than the total range of the distributions 60*a* and 60*b* illustrated in FIG. 5 (indicated by dotted lines in FIG. 6).

In this manner, variations in gate delay caused by double patterning may be reduced by using the transistors in pairs by connecting the gate electrode patterns 11 and 13 formed in the first exposure step to the gate electrode patterns 14 and 12 formed in the second exposure step, respectively, in parallel.

Figure 7:
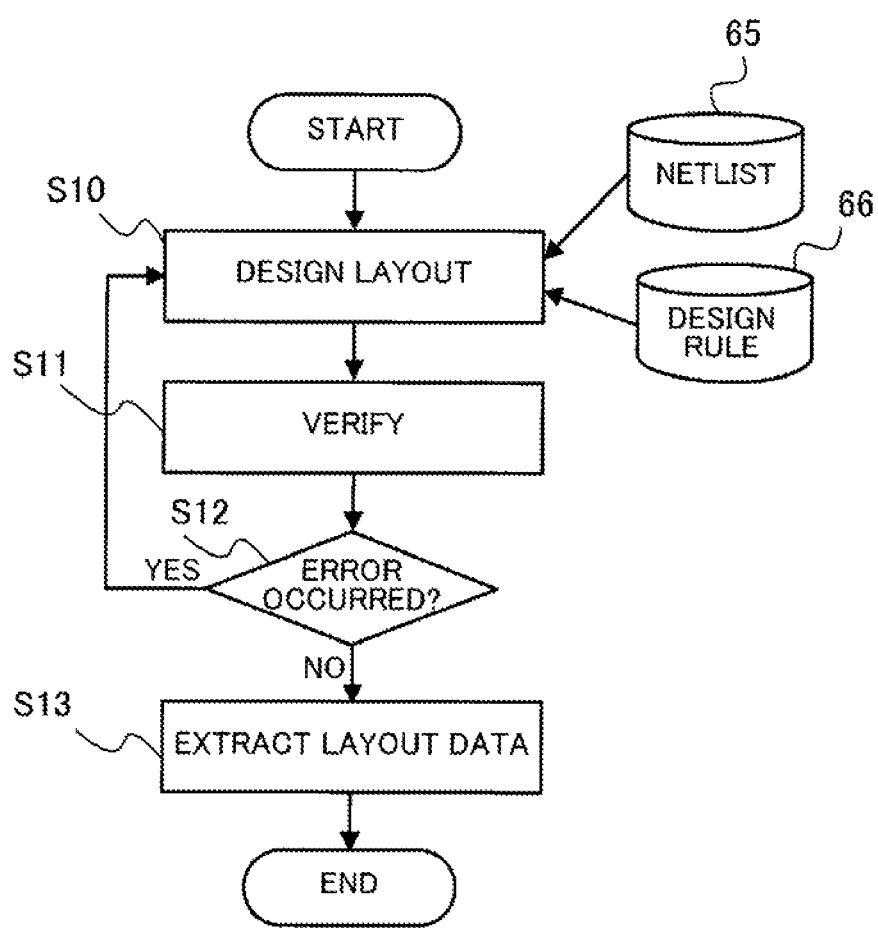
FIG. 7 is a flow chart illustrating an example processing flow in a layout step.

FIG. 7 is a flow chart illustrating an example processing flow in a layout step.

The design apparatus receives a netlist 65 and a design rule 66 to design a layout using the layout method as illustrated in FIG. 1 (Step S10). Subsequently, the design apparatus performs verification (Step S11) such as design rule checking (DRC) or layout versus schematic (LVS), and determines whether or not an error occurs (Step S12). If an error occurs as a result of verification, the process is repeated from Step S10. If no error occurs, the design apparatus extracts layout data (Step S13).

In a process of manufacturing a semiconductor device, masks are formed on the basis of the layout data and the like generated in the layout step, and double patterning, that is, exposure using the masks and etching, is performed so that gate electrode patterns and the like are formed. Subsequently, a wiring step, for example, is carried out to complete the semiconductor device.

Figure 8:
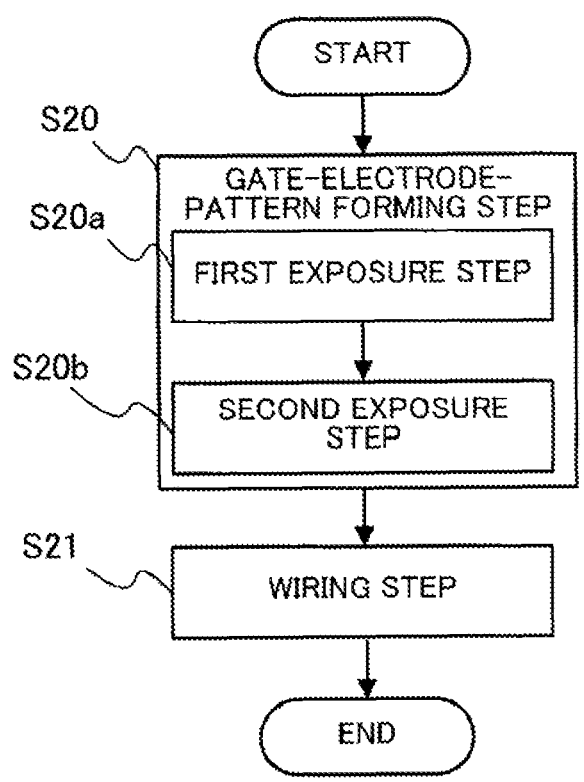
FIG. 8 is a flow chart illustrating a flow of part of a process of manufacturing a semiconductor device.

FIG. 8 is a flow chart illustrating a flow of part of the process of manufacturing the semiconductor device.

The gate electrode patterns 10 to 15 designed as illustrated in FIG. 1 are formed in a gate-electrode-pattern forming step (Step S20). As described above, the gate electrode patterns 10 to 15 are formed by double patterning. The gate-electrode-pattern forming step includes a first exposure step (Step S20*a*) and a second exposure step (Step S20*b*).

In the first exposure step, the gate electrode patterns 11, 13, and 15, for example, are formed by exposure using an exposure apparatus in accordance with the details set in the layout step. The gate electrode pattern 11 is used as the gates of the transistors Tr1 and Tr7 illustrated in FIG. 2, and the gate electrode pattern 13 is used as the gates of the transistors Tr4 and Tr6 illustrated in FIG. 2.

In the second exposure step, the gate electrode patterns 10, 12, and 14, for example, are formed by exposure using the exposure apparatus in accordance with the details set in the layout step. The gate electrode pattern 12 is used as the gates of the transistors Tr3 and Tr5 illustrated in FIG. 2, and the gate electrode pattern 14 is used as the gates of the transistors Tr2 and Tr8 illustrated in FIG. 2.

In the gate-electrode-pattern forming step, the gate electrode patterns 11 to 15 are completed by etching.

Subsequently, a wiring step (Step S21) is performed after source electrode patterns and drain electrode patterns (not illustrated) are formed. In the wiring step, wiring lines are formed in accordance with the layout as illustrated in FIG. 1. In this embodiment, for example, wiring lines are formed so as to connect the gate electrode patterns 11 and 13 formed in the first exposure step to the gate electrode patterns 14 and 12 formed in the second exposure step, respectively, in parallel.

Subsequently, various tests and assembly are performed to complete the semiconductor device.

Although an example of laying out a two-input NAND circuit has been described above, the layout method is not limited to this.

The layout method may be applied to lay out circuits including transistors with smaller variations in the characteristics. The circuits include, for example, those used in critical paths such as clock lines (for example, flip-flops) and current mirror circuits.

That is, the use of the transistors in pairs, formed by the gate electrode patterns formed in the first exposure step and those formed in the second exposure step laid out so as to be connected in parallel, may reduce variations in gate delay caused by double patterning.

(b) Second Embodiment

Figure 9:
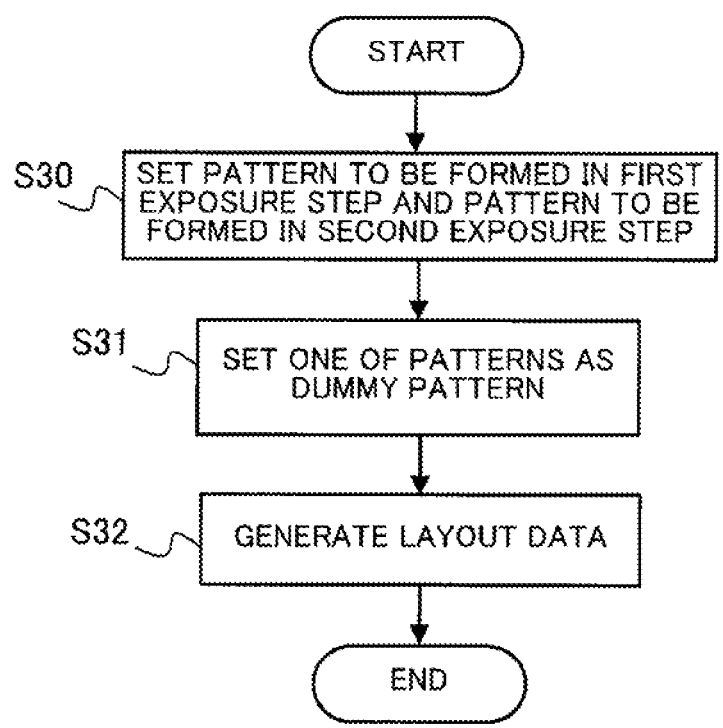
FIG. 9 is a flow chart illustrating an example layout method according to a second embodiment.

FIG. 9 is a flow chart illustrating an example layout method according to a second embodiment.

As in the layout method according to the first embodiment, a design apparatus alternately sets gate electrode patterns to be laid out in parallel as patterns to be formed in a first exposure step of double patterning and as patterns to be formed in a second exposure step (Step S30).

Figure 10:
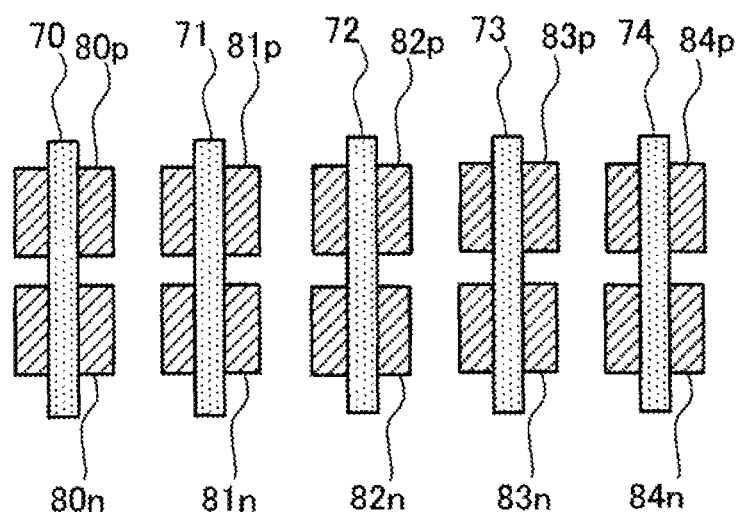
FIG. 10 illustrates example gate electrode patterns laid out in parallel.

FIG. 10 illustrates example gate electrode patterns laid out in parallel.

In FIG. 10, MOSFET gate electrode patterns 70 to 74 are laid out in parallel. The gate electrode patterns 70 to 74 are laid out on active regions 80*p* to 84*p* for p-channel MOSFETs, respectively, and active regions 80*n* to 84*n* for n-channel MOSFETs, respectively.

In the operation in Step S30, the design apparatus sets, for example, the gate electrode patterns and 73 as first patterns to be formed in the first exposure step, and sets the gate electrode patterns 70, 72, and 74 as second patterns to be formed in the second exposure step.

Subsequently, the design apparatus sets one of the first and second set patterns as dummy patterns (Step S31). For example, the design apparatus sets the gate electrode patterns 70, 72, and 74 formed in the second exposure step as the dummy patterns.

Next, the design apparatus lays out a circuit that includes transistors formed using the gate electrode patterns except for those set as the dummy patterns to generate layout data (Step S32).

Figure 11:
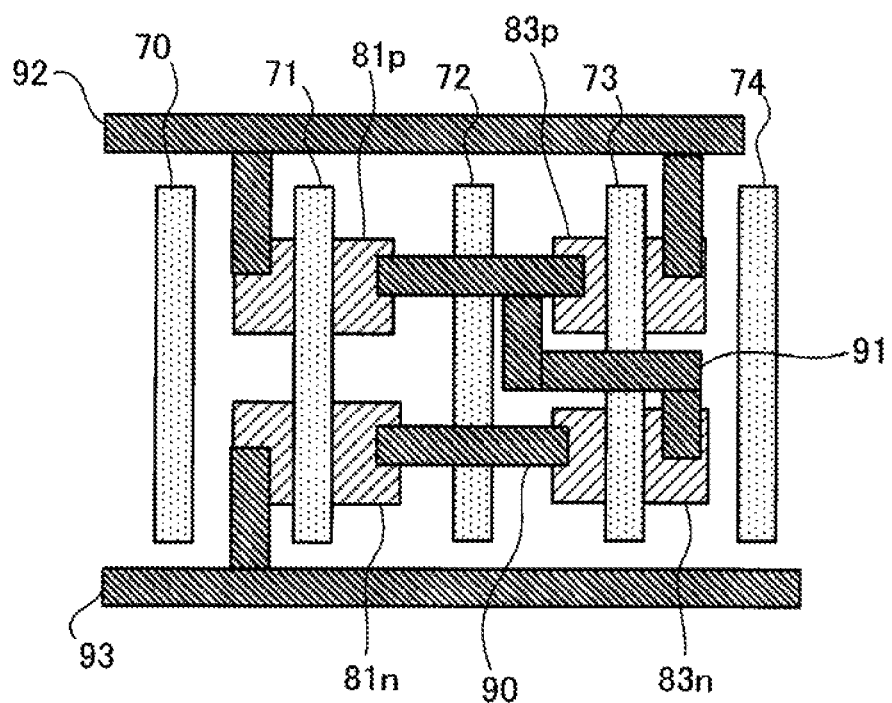
FIG. 11 illustrates an example layout provided by the layout method according to the second embodiment.

FIG. 11 illustrates an example layout provided by the layout method according to the second embodiment.

FIG. 11 illustrates an example layout of a two-input NAND circuit when the gate electrode patterns 70, 72, and 74 are set as the dummy patterns in Step S31.

In FIG. 11, the two-input NAND circuit is laid out using the gate electrode patterns 71 and 73, a wiring pattern 90 that connects the active regions 81*n* and 83*n*, a wiring pattern 91 that connect the active regions 81*p*, 83*p*, and 83*n*, a VDD power wiring pattern 92, and a VSS power wiring pattern 93.

The active regions 80*p* and 80*n*, 82*p* and 82*n*, and 84*p* and 84*n* (see FIG. 10) laid under the gate electrode patterns 70, 72, and 74, respectively, that are set as the dummy patterns are eliminated from the layout.

The circuit diagram of the two-input NAND circuit provided by this layout is the same as that illustrated in FIG. 4.

However, in the layout method according to the second embodiment, the gate electrode patterns formed in one of the exposure steps of double patterning are set as the dummy patterns, and are not used to form transistors. This reduces the risk of variations in characteristics of the transistors. For example, the distribution of variations in the characteristics of the transistors may be limited to one of the two distributions 60a and 60b illustrated in FIG. 5.

In addition, only the gate element patterns formed in one of the two exposure steps of double patterning are used to form the transistors. This facilitates estimation of variations in the characteristics of the transistors.

The layout method according to the second embodiment may be performed in the layout designing (Step S10) illustrated in FIG. 7. In addition, the process of manufacturing the semiconductor device as illustrated in FIG. 8 may be carried out on the basis of the layout data as illustrated in FIG. 11.

That is, the gate electrode patterns of the transistors are formed by exposure in the first exposure step, and the dummy gate electrode patterns (that is, dummy patterns) to be laid out parallel to the gate electrode patterns formed in the first exposure step are formed by exposure in the second exposure step.

Alternatively, the dummy patterns may be formed in the first exposure step, and the gate electrode patterns may be formed in the second exposure step.

Although an example of laying out a two-input NAND circuit has been described above, the layout method is not limited to this.

The layout method may be applied to lay out circuits including transistors with smaller variations in the characteristics. The circuits include, for example, those used in critical paths such as clock lines (for example, flip-flops) and current mirror circuits.

That is, formation of the transistors using the gate electrode patterns formed in the first exposure step or those formed in the second exposure step during layout may reduce variations in gate delay caused by double patterning.

The first and second layout methods may be implemented by, for example, a computer as described below.

FIG. 12 illustrates an example hardware configuration of a computer used in the first and second embodiments. A computer 100 is controlled by a central processing unit (CPU) 101. The CPU 101 is connected to a random access memory (RAM) 102 and a plurality of peripherals via a bus 108.

The RAM 102 is used as a main storage of the computer 100. The RAM 102 temporarily stores at least part of operating system (OS) programs and application programs executed by the CPU 101. The RAM 102 also stores various data that the CPU 101 uses for processing.

The peripherals connected to the bus 108 include a hard disk drive (HDD) 103, a graphics processor 104, an input interface 105, an optical drive device 106, and a communication interface 107.

The HDD 103 magnetically reads data from and writes data to a built-in disk. The HDD 103 is used as a secondary storage of the computer 100. The HDD 103 stores OS programs, application programs, and various data. A semiconductor storage device such as a flash memory may also be used as the secondary storage.

The graphics processor 104 is connected to a monitor 104a. The graphics processor 104 displays pictures on a screen of the monitor 104a in accordance with commands from the CPU 101. The monitor 104a includes, for example, a display device including a cathode ray tube (CRT) and a liquid crystal display.

The input interface 105 is connected to a keyboard 105a and a mouse 105b. The input interface 105 transmits signals sent from the keyboard 105a and the mouse 105b to the CPU 101. Herein, the mouse 105b is an example of a pointing device, and other pointing devices may be used. The other pointing devices include, for example, a touch panel, a tablet, a touch pad, and a trackball.

The optical drive device 106 reads data recorded in an optical disk 106a using, for example, laser light. The optical disk 106a is a portable recording medium in which data is recorded so as to be readable using light reflection. The optical disk 106a includes, for example, a digital versatile disc (DVD), a DVD-RAM, a compact disc read-only memory (CD-ROM), a CD-recordable (CD-R), and a CD-rewritable (CD-RW).

The communication interface 107 is connected to a network 107a. The communication interface 107 transmits data to and receives data from other computers or communication devices via the network 107a.

The hardware configuration described as above may implement processing functions according to the first and second embodiments.

The layout method and the method of manufacturing the semiconductor device reduce the risk of variations in characteristics of transistors caused by double patterning.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A layout method performed by a computer, comprising:
  alternately setting, by the computer, a plurality of gate electrode patterns to be laid out in parallel as a first pattern to be formed in a first exposure step of double patterning and a second pattern to be formed in a second exposure step of the double patterning; and
  laying out, by the computer, a circuit that includes a transistor pair formed from a first transistor whose gate electrode is of the first pattern and a second transistor whose gate electrode is of the second pattern and connected to the gate electrode of the first transistor via a wiring pattern, the first transistor having a first source and a first drain connected respectively to a second source and a second drain of the second transistor.

2. The layout method according to claim 1, wherein the gate electrode patterns are laid out such that an input signal is supplied in parallel to the gate electrode pattern set as the first pattern and that set as the second pattern in the transistor pair.

3. A method of manufacturing a semiconductor device using double patterning, the method comprising:
  first exposure for forming a first gate electrode pattern of a first transistor by exposure;
  second exposure for forming a second gate electrode pattern of a second transistor by exposure, the second gate electrode pattern being laid out parallel to the first gate electrode pattern; and
  wiring for connecting the first gate electrode pattern of the first transistor with the second gate electrode pattern of the second transistor via a wiring pattern, as well as connecting a first source and a first drain of the first transistor with a second source and a second drain of the second transistor, respectively.

4. The method according to claim 1, wherein the first transistor and the second transistor are both p-type transistors or both n-type transistors.

5. The method according to claim 3, wherein the first transistor and the second transistor are both p-type transistors or both n-type transistors.

6. A layout method performed by a computer, comprising:
alternately setting, by the computer, a plurality of gate electrode patterns to be laid out in parallel as a first pattern to be formed in a first exposure step of double patterning and a second pattern to be formed in a second exposure step of the double patterning; and
laying out, by the computer, a circuit that includes a first transistor pair formed from a first transistor whose gate electrode is of the first pattern and a second transistor whose gate electrode is of the second pattern and connected to the gate electrode of the first transistor via a first wiring pattern, and includes a second transistor pair formed from a third transistor whose gate electrode is of the first pattern and a fourth transistor whose gate electrode is of the second pattern and connected to the gate electrode of the third transistor via a second wiring pattern, a first node connected to a drain of the first transistor and a drain of the second transistor, and a second node connected to a source of the third transistor and a source of the fourth transistor, the first and fourth transistors being inserted in series between the first node and the second node, the second and third transistors being inserted in series between the first node and the second node.

7. The method according to claim 6, wherein the first, second, third, and fourth transistors are all p-type transistors or all n-type transistors.

8. A semiconductor device, comprising:
a first transistor including a first gate electrode formed in a first exposure step of double patterning, besides including a first source and a first drain;
a second transistor including a second gate electrode formed in a second exposure step of double patterning and laid out parallel to the first gate electrode pattern, besides including a second source and a second drain;
a first wiring pattern that connects the first gate electrode of the first transistor to the second gate electrode of the second transistor;
a second wiring pattern that connects the first source of the first transistor to the second source of the second transistor; and
a third wiring pattern connecting the first drain of the first transistor to the second drain of the second transistor.

9. The semiconductor device according to claim 8, wherein the first transistor and the second transistor are both p-type transistors or both n-type transistors.

10. A semiconductor device, comprising:
a first transistor including a first gate electrode formed in a first exposure step of double patterning, besides including a first source and a first drain;
a second transistor including a second gate electrode formed in a second exposure step of double patterning and laid out parallel to the first gate electrode pattern, besides including a first source and a second drain;
a third transistor including a third gate electrode formed in the first exposure step of double patterning, besides including a third source and a third drain;
a fourth transistor including a fourth gate electrode formed in the second exposure step of double patterning and laid out parallel to the third gate electrode pattern, besides including a fourth source and a fourth drain;
a first node connected to the first drain of the first transistor and the second drain of the second transistor; and
a second node connected to the third source of the third transistor and the fourth source of the forth transistor,
wherein the first transistor and the fourth transistor are inserted in series between the first node and the second node, and the second transistor and the third transistor are inserted in series between the first node and the second node.

11. The semiconductor device according to claim 10, wherein the first, second, third, and fourth transistors are all p-type transistors or all n-type transistors.

* * * * *